(12) United States Patent
Todorov et al.

(10) Patent No.: US 6,533,521 B1
(45) Date of Patent: Mar. 18, 2003

(54) INTEGRATED SUBSTRATE HANDLER HAVING PRE-ALIGNER AND STORAGE POD ACCESS MECHANISM

(75) Inventors: Alexander Todorov, Sunnyvale, CA (US); Mila Genov, San Jose, CA (US)

(73) Assignee: Genmark Automation, Inc., Sunnyvale, CA (US)

(*) Notice: Subject to any disclaimer, the term of this patent is extended or adjusted under 35 U.S.C. 154(b) by 0 days.

(21) Appl. No.: 09/822,974

(22) Filed: Mar. 29, 2001

(51) Int. Cl.⁷ .............................................. B65G 49/07
(52) U.S. Cl. .................... 414/217.1; 414/936; 414/937; 414/939
(58) Field of Search ............................ 414/217.1, 783, 414/936, 937, 939

(56) References Cited

U.S. PATENT DOCUMENTS

| | | |
|---|---|---|
| 5,607,276 A | 3/1997 | Muka et al. |
| 5,609,459 A | 3/1997 | Muka |
| 5,613,821 A | 3/1997 | Muka et al. |
| 5,664,925 A | 9/1997 | Muka et al. |
| 5,772,386 A * | 6/1998 | Mages et al. ............... 414/939 |
| 6,013,920 A * | 1/2000 | Gordon et al. .............. 414/937 |
| 6,053,688 A * | 4/2000 | Cheng ........................ 414/939 |
| 6,082,951 A * | 7/2000 | Nering et al. ............... 414/939 |
| 6,120,229 A * | 9/2000 | Hofmeister ................. 414/937 |
| 6,142,722 A | 11/2000 | Genov et al. |
| 6,158,946 A * | 12/2000 | Miyashita ................... 414/939 |

\* cited by examiner

Primary Examiner—Kathy Matecki
Assistant Examiner—Sang Kim
(74) Attorney, Agent, or Firm—Thelen Reid & Priest LLP; Robert E. Krebs

(57) ABSTRACT

Access to the interior of a substrate storage pod in which substrates such as semiconductor wafers are stored is gained using an access device provided within a micro environment enclosure. The access device has a telescoping enclosure door which serves to control access to the interior of the storage pod from the interior of the enclosure. A pre-aligner is mounted to the enclosure door, and substrates are passed through the pre-aligner as they are retrieved from the storage pod. The pre-aligner detects and adjusts the orientation of the substrates as necessary for processing. The level of the pre-aligner is incrementally adjusted to match that of a current substrate by incrementally adjusting the level of the enclosure door.

22 Claims, 7 Drawing Sheets

INTEGRATED SUBSTRATE HANDLER HAVING PRE-ALIGNER AND STORAGE POD ACCESS MECHANISM

BACKGROUND OF THE INVENTION

The invention relates to substrate processing systems, and more particularly, to systems for accessing and orienting substrates such as semiconductor wafers during integrated circuit fabrication.

DESCRIPTION OF RELATED ART

Substrates such as semiconductor wafers are processed in micro environment enclosures in which conditions are carefully managed such that temperature and humidity are controlled, and use is made of air filtration systems which remove contaminants that would otherwise corrupt the delicate manufacturing procedures involved. Complex systems are used to effect these controls, and expedients used include establishing laminar flows within the micro environment enclosure to direct air flow towards the filtration devices.

The substrates, prior to loading into the micro environment enclosure, are conventionally handled in protective containers which seal out contaminants. One type of industry standard container is referred to as a front opening universal pod (FOUP) and is used to store the substrates in a stacked arrangement. The door of the FOUP, from which the interior is accessed, is disposed at the front and is detachable such that when the FOUP is engaged with the enclosure of the micro environment in which the substrates are to be processed, the door is removed to a remote location and access to the substrates is facilitated. The micro environment system has one or more processing stations into and out of which the substrates, for instance semiconductor wafers, are transferred from the FOUPs.

When the wafers are ready for processing, the pod containing the wafers is docked with an interface portion of the micro environment, which may be referred to as a load lock chamber. The load lock chamber is provided with a port having a door supported therein. The door, normally closed to preserve the micro environment conditions, is opened when the pod is in the docked position. A door of the pod is also opened, thereby permitting transport of the semiconductor wafers between the pod and the micro environment through the load lock chamber. The mating of the pod to the load lock chamber is carefully controlled, and the door opening process coordinated, so that the integrity of the micro environment is undisturbed during the loading and unloading process.

Opening and closing of the pod and load lock chamber doors is automated. An opening mechanism provided in the load lock chamber simultaneously engages both doors, often sealing them together to sandwich contaminants therebetween, and removes them along a transport path to a remote position to thereby facilitate transfer of the wafers, by a different loading and unloading mechanism, between the pod and the load lock chamber. Prior art devices of this type include U.S. Pat. No. 5,607,276 to Muka, et al., U.S. Pat. No. 5,609,459 to Muka, U.S. Pat. No. 5,613,821 to Muka, et al., and U.S. Pat. No. 5,664,925 to Muka, et al. A typical prior art opening and closing configuration relies on an upright lever which engages both the pod and load lock chamber doors. The lever then swings internally, away from the pod, along a shallow angle, pulling the doors internally with it. When sufficient clearance is thus achieved, the lever, along with the doors, descends downward within the load lock chamber, leaving the pod-load lock chamber interface clear for access to the interior of the pod. The substrates are then withdrawn from the pod, processed, and returned, using suitable robot arms. Once processing is complete and the substrates returned to the pod, the process is reversed and the pod and load lock chamber are again sealed from each other.

Another prior art device, the subject of U.S. Pat. No. 6,142,722, is directed to opening and closing pod and load lock chamber doors using the wafer handling robot itself. The arm of the robot, using a specialized, detachable tool, engages both doors and transports these to a dedicated location within the micro environment. The arm then accesses the substrates in the pod, delivers them to the appropriate processing stations, then returns them to the pod and reseals the pods with the retrieved doors.

FIG. 1 shows a prior art semiconductor processing system in which a robot 10 is enclosed within a micro-environment enclosure 12. Various processing stations 14, which may include storage pods for holding a plurality of stacked substrates (not shown), are in communication with the micro environment within the enclosure 12. Robot 10 is provided with a robot arm 16 which supports an end effector 18 used to hold semiconductor substrates as these are retrieved from the various stations 14. Disposed within micro environment enclosure 12 is an alignment device 15 to which the semiconductor substrates are transported by robot arm 16 in order to determine and/or adjust the orientation of the semiconductor substrates. To that end, substrates such as wafers are provided with a notch at the edge, which notch is suitably detected by, for example, a photoelectric sensor provided in alignment device 20. During operation, robot 10, for example, retrieves a wafer from one of the stations 14, transports the wafer to alignment device 15 where its orientation is determined and/or adjusted, then deposits the wafer at a different station (or the same station) 14.

The aforementioned prior art alignment system introduces several additional steps associated with the alignment device 15. For example, the substrate has to first be transported to the alignment device 15 and deposited therein, then after orientation determination and/or adjustment, the substrate has to be retrieved from the alignment device and then transported to the destination station 14. This represents a disruption in the flow path and introduces various steps which increase processing time and potential malfunction.

BRIEF SUMMARY OF THE INVENTION

The invention overcomes shortcomings of the prior art, providing an integrated substrate handler for use in a system in which the interior of a substrate storage pod having a removable pod door is accessed from the interior of a micro environment enclosure. The integrated substrate handler is provided with an enclosure door mounted for movement between one or more open positions and a closed position, wherein in an open position the interior of the substrate storage pod is accessible from the interior of the micro environment enclosure. The integrated substrate handler is also provided with a pre-aligner mounted for movement with the enclosure door, the pre-aligner being adapted to detect the orientation of a substrate.

Further in accordance with the invention, a method is provided wherein an enclosure door and a pre-aligner are moved incrementally to a plurality of open positions. A substrate is transported from the interior of the substrate storage pod to the pre-aligner, and the orientation of the of the transported substrate at the pre-aligner.

Further in accordance with the invention, a method is provided wherein the an enclosure door and a pre-aligner are moved to a plurality of open positions corresponding to storage locations of a substrate storage pod, and a substrate is transported between the interior of the substrate storage pod and the interior of a micro environment enclosure.

BRIEF DESCRIPTION OF THE SEVERAL VIEWS OF THE DRAWING

Many advantages of the present invention will be apparent to those skilled in the art with a reading of this specification in conjunction with the attached drawings, wherein like reference numerals are applied to like elements and wherein.

DETAILED DESCRIPTION OF THE INVENTION

Figure 1:
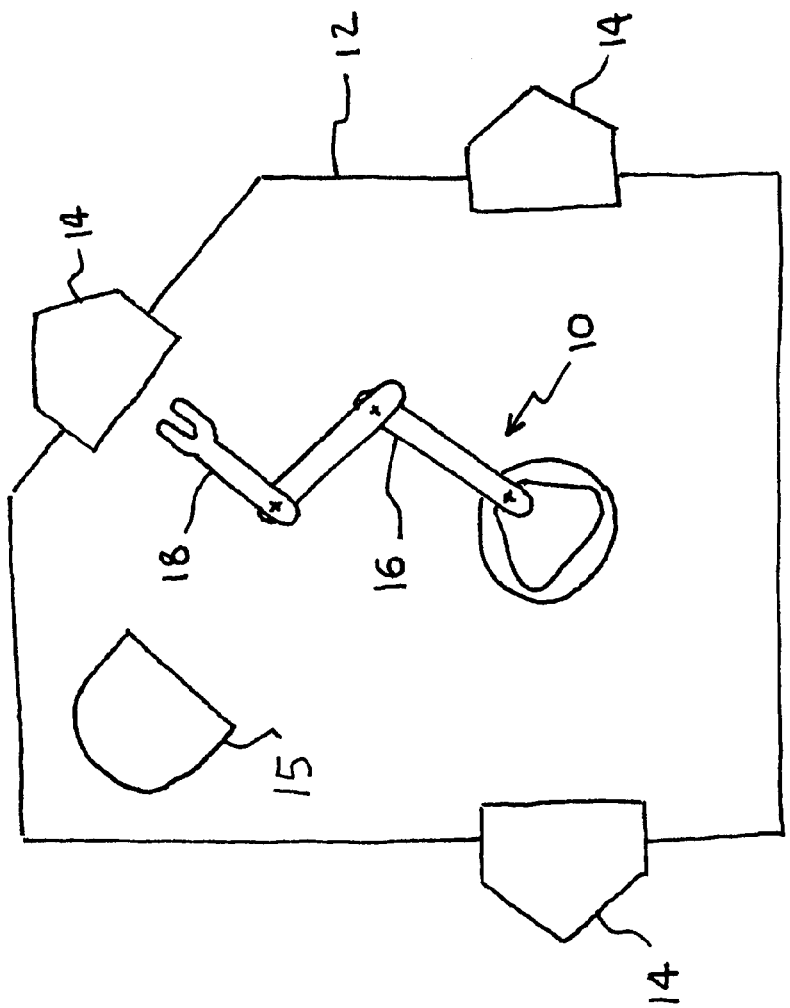
FIG. 1 is a schematic top plan view of a semiconductor processing system of the prior art.
Figure 2B:
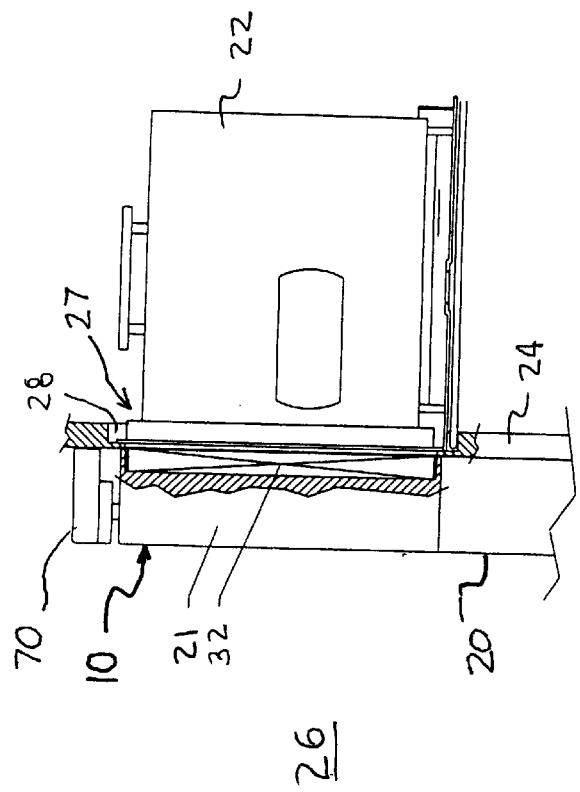
FIGS. 2A and 2B are partial sectional side elevational views of a substrate storage pod in mating engagement with an integrated substrate pre-aligner and storage pod access device in accordance with the invention.
Figure 2A:
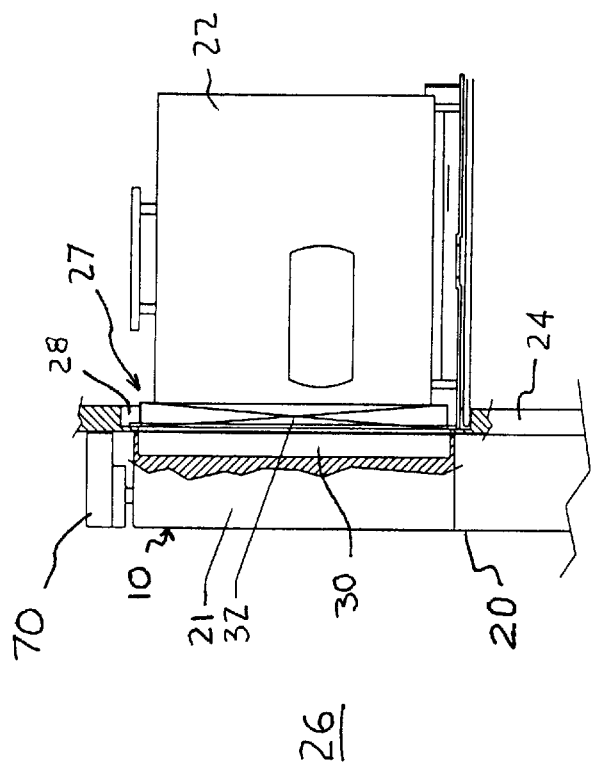

FIGS. 2–7 show an integrated substrate handler 10 in accordance with the invention. As seen from FIGS. 2A and 2B, the integrated substrate handler 10, which is disposed within a micro environment enclosure 26, comprises a pre-aligner 70 which is mounted to an enclosure door 21. A storage pod 22 is shown in an engagement position against the exterior wall 24 of micro environment enclosure 26. Wall 24 has a port 28 through which access to micro environment enclosure 26 is gained. An access mechanism 20 actuates enclosure door 21, which, in a first position depicted in FIGS. 2A and 2B, seals port 28 of wall 24. As described in further detail below, enclosure door 21 is mounted for translational motion in the direction of double-headed arrow A.

Enclosure door 21 is provided with a recess 30 for receiving therein (FIG. 2B) removable pod door 32 during operation in which access to the interior of pod 22 is gained from the interior of micro environment enclosure 26. Pre-aligner 70 is preferably mounted on a top portion of enclosure door 21. Pre-aligner 70 will be discussed in greater detail with reference to FIGS. 6 and 7 below.

Figure 3A:
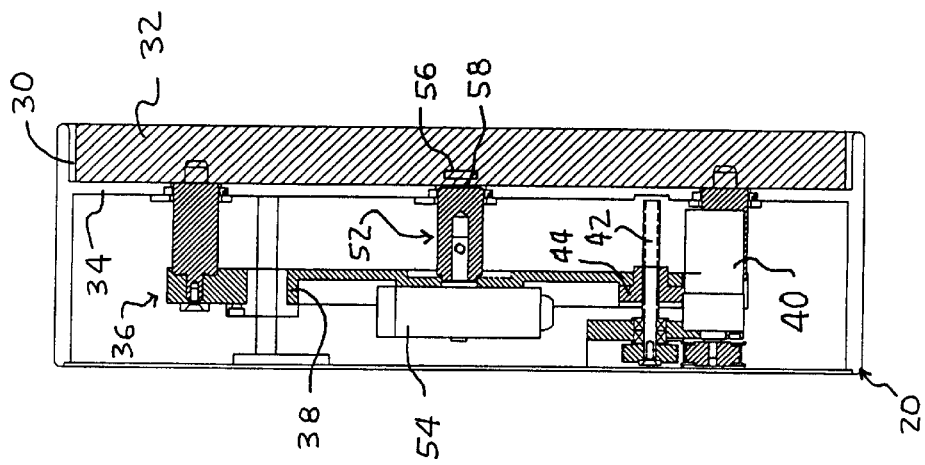
FIGS. 3A and 3B are cross-sectional views of a translational motion assembly of an integrated substrate pre-aligner and storage pod access device in accordance with the invention.
Figure 3B:
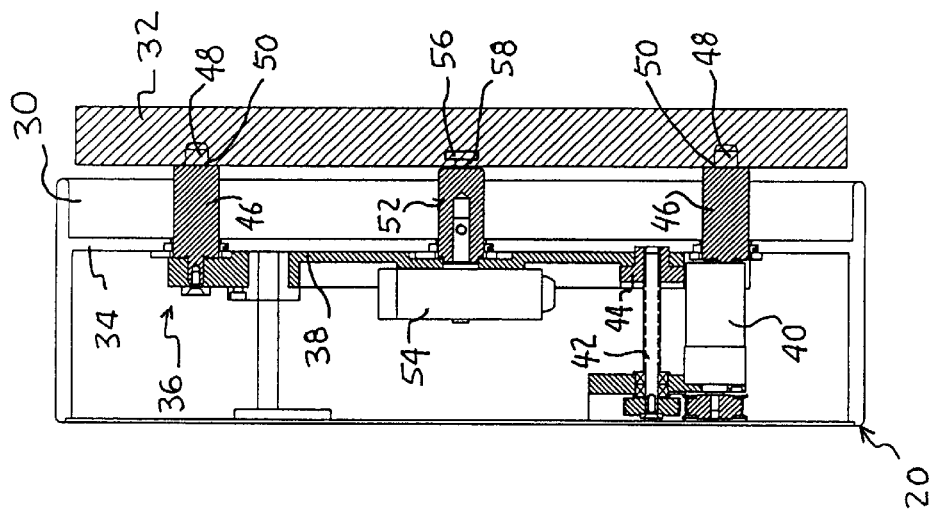

Access mechanism 20 and enclosure door 21 are shown in greater detail in FIGS. 3A and 3B and include a frame 34 to which a translational motion assembly 36 is movably mounted. Assembly 36 includes a platform 38 whose motion is actuated by a motor 40 and a linkage consisting of rotatable ball screw 42 threadingly engaging nut 44 rigidly mounted to platform 38. Also rigidly mounted to platform 38 are extensions 46 having alignment pins 48 which mate with corresponding holes 50 provided on pod door 32, and at least one latching mechanism 52 which engages door 32. During engagement of latching mechanism 52 with pod door 32, motion of platform 38 and latching mechanism 52 induces motion of pod door 32 such that pod door 32 can be translated in a straight path along the axial direction of latching mechanism 52. Engagement and disengagement of latching mechanism 52 from pod door 32 is effected by actuation of a latch motor 54 mechanically linked to a latch 56 which mates with a corresponding hole 58. This mating also serves to engage or disengage pod door 32 from pod 22, via a suitable linkage in pod door 32 (not shown). In this manner the translational motion assembly 36 can grip pod door 32, disengage it from pod 22, and translate the pod door into recess 30 of enclosure door 21. It can also perform the reverse operation, translating pod door 32 out of recess 30 and engaging it with pod 22, then disengaging from the pod door. The integrity of the micro environment enclosure 26 is substantially preserved during these operations by maintaining a seal between storage pod 22 and wall 24 of the enclosure in the vicinity of port 28. Specifically, a seal, indicated generally at 27, is formed at the perimeters of port 28 and the opening in storage pod 22 which results from removal of door 32 from the storage pod. This seal is maintained using biasing means (not shown) which exerts sufficient pressure to bias the pod 22 against wall 24.

Figure 4B:
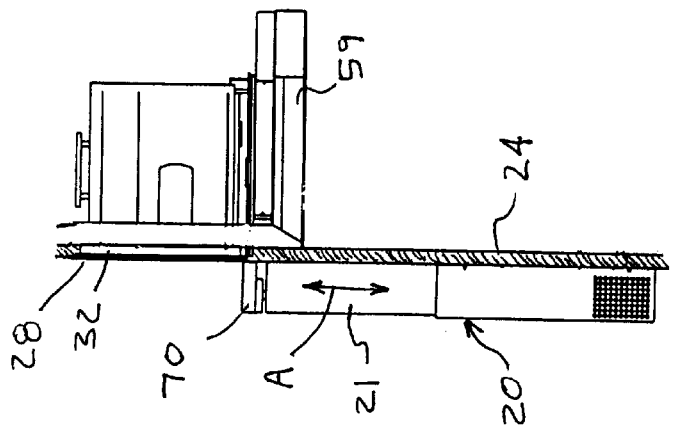
FIGS. 4A and 4B are side elevational views showing the operation of a transverse motion assembly of an integrated substrate pre-aligner and storage pod access device in accordance with the invention.
Figure 4A:
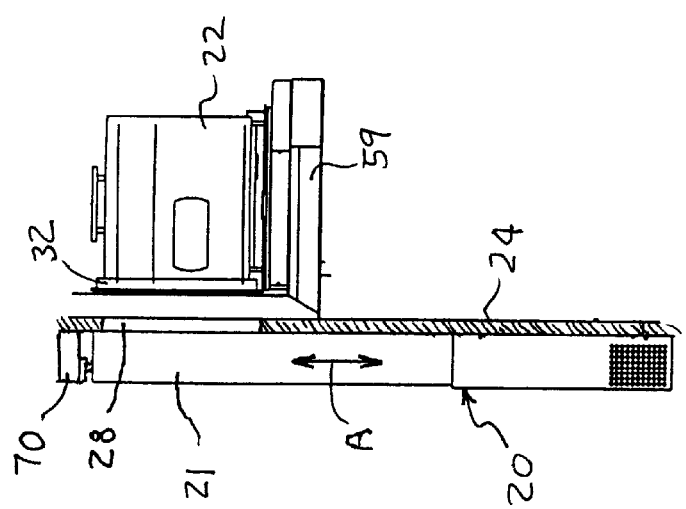

FIGS. 4A and 4B show enclosure door 21 in closed and open positions, respectively. Door 21 is slidably mounted and translates in the direction of double-headed arrow A such that when the door is in the open position, access to the interior of pod 22 is gained from micro environment enclosure 26. It will be appreciated that this access is attained after pod 22 is drawn into a sealed mating position against wall 24, and specifically, against port 28, as shown in FIG. 4B. In this manner, substrates (not shown) can be loaded and unloaded into enclosure 26 from pod 22, by a suitably equipped substrate handling robot (not shown). It will further be appreciated that when pod 22 is not in this sealed position—for example, when it is in the position shown in FIG. 4A—door 21 is closed, thereby serving to hermetically seal port 28 and enclosure 26 against the exterior. Pod 22 can be translated to and from the sealed position of FIG. 4B manually or by mechanical means (not shown) disposed in support 59, which mechanical means can further be used to provide the requisite biasing for maintaining the enclosure-pod seal discussed above.

Figure 5:
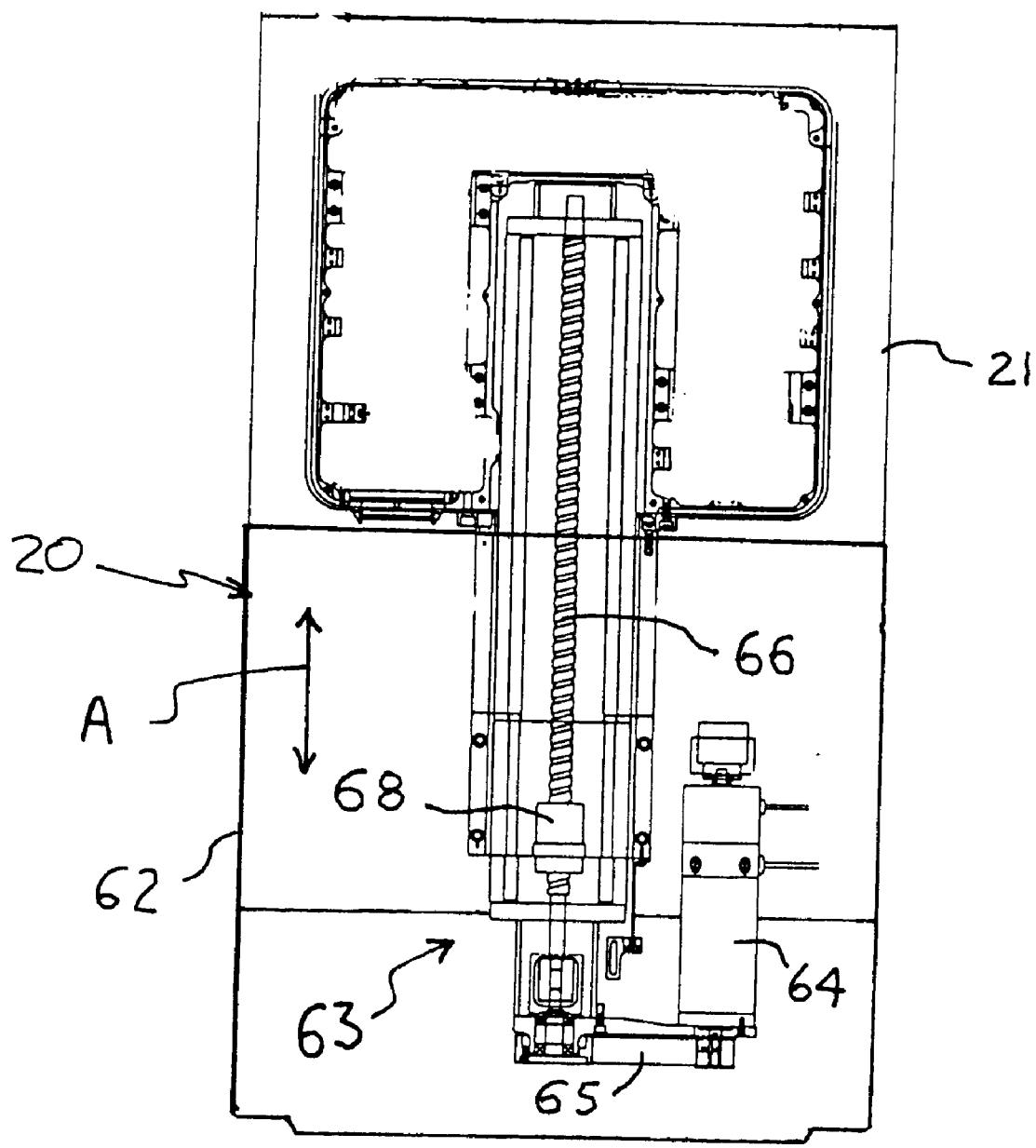
FIG. 5 is a front elevational view of the a transverse motion assembly of an integrated substrate pre-aligner and storage pod access device in accordance with the invention.

The mechanism by which enclosure door 21 is translated between the open and closed positions along the path indicated by double-headed arrow A is shown in detail in FIG. 5. Enclosure door 21 is movably mounted in housing 62, which housing is rigidly affixed to wall 24 of enclosure 26. Motion of enclosure door 21 is imparted by a transverse motion assembly 63, which comprises a motor 64 mechanically linked to door 21 by way of belt 65, ball screw 66, and nut 68. Actuation of motor 64 causes rotation of ball screw 66, which matingly threads through nut 68 and causes motion of door 21 in the direction of double-headed arrow A such that door 21 effectively telescopes in and out of housing 62. It will be appreciated that transverse motion assembly 63 can comprise components different from those described but still operating to move enclosure door 21 along the path indicated by double-headed arrow A.

Figure 6:
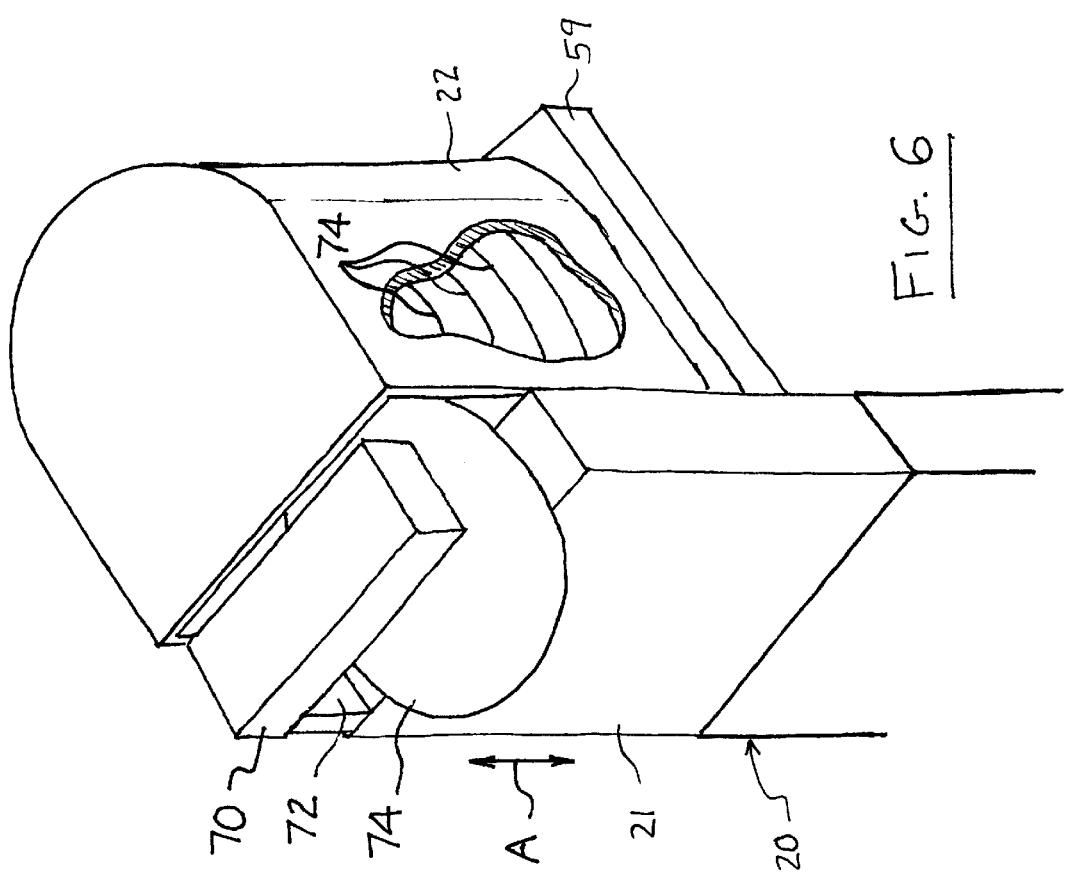
FIG. 6 is a perspective view of an integrated substrate pre-aligner and storage pod access device in accordance with the invention.

Pre-aligner 70 is discussed with reference to FIGS. 6 and 7. As shown generally in FIG. 6, pre-aligner 70 is mounted on enclosure door 21, and is generally U-shaped so as to have an opening 72 for accommodating semiconductor wafers 74 therein. The wafers 74 are delivered to pre-aligner 70, preferably as they are being retrieved from storage pod 22 and loaded into micro environment enclosure 26, using the handling robot (not shown) disposed within the enclosure. Pre-aligner 70 operates to determine the orientation of each wafer 74, and to adjust this orientation if necessary, as discussed below.

Figure 7:
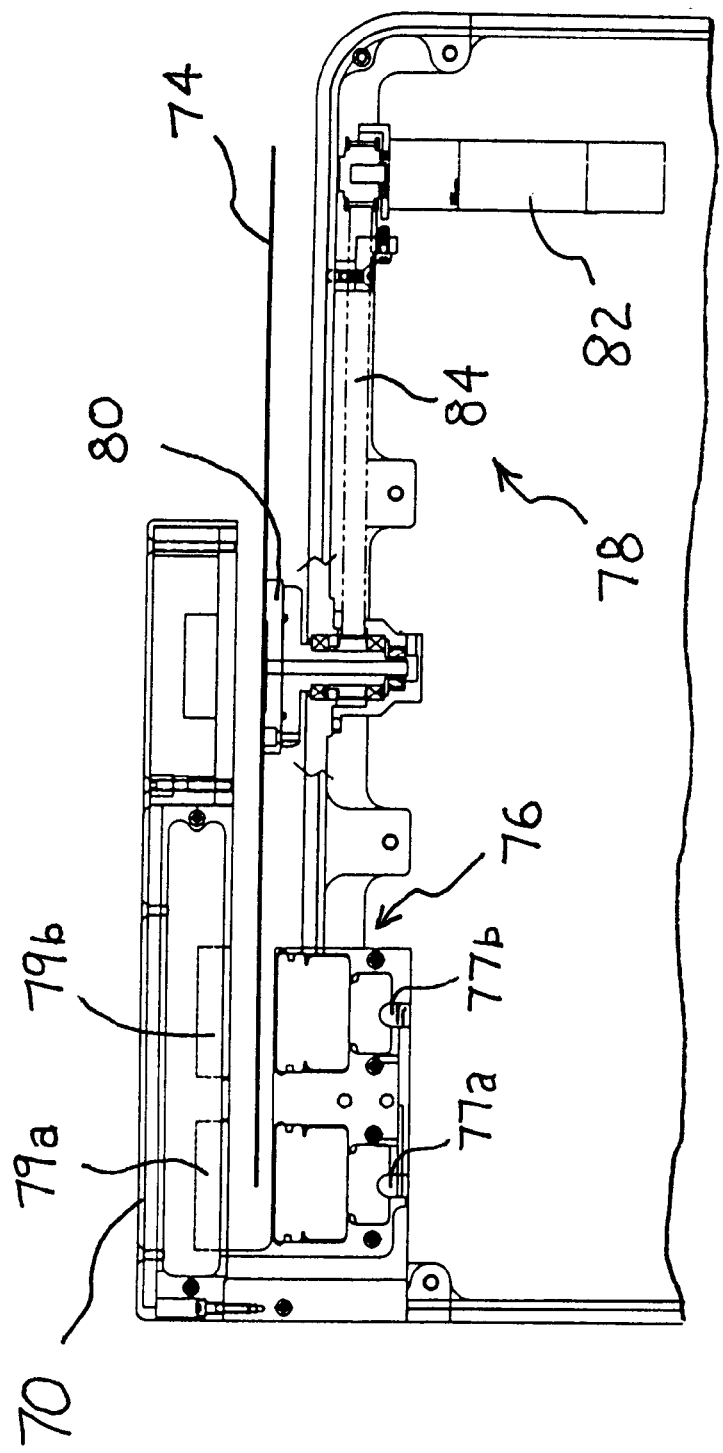
FIG. 7 is a front sectional view of an integrated substrate pre-aligner and storage pod access device in accordance with the invention.

As shown in greater detail in FIG. 7, pre-aligner 70 has a detecting assembly 76 and an orienting assembly 78. The detecting assembly 76 is designed to detect a reference indicium, such as an edge notch (not shown), provided on the semiconductor wafer 74. It will be appreciated that any known means of detecting reference indicia can be employed, including optical light transmission and/or reflection type devices which rely on the use of a CCD (charge coupled device) or other detector. The detecting assembly 76 generates an appropriate signal indicative of the presence of the reference indicium at a predetermined position, which in turn reveals the orientation of the semiconductor wafer 74. Detecting assembly 76 is shown as comprising a pair of CCD cameras 79a and 79b, each positioned to correspond to an edge a wafer of a particular size. For instance, wafer 74 shown in FIG. 7 is a standard 300 mm wafer and is associated with CCD camera 79a. Alternatively, when a 200 mm wafer is being detected, CCD camera 79b is positioned to detect an edge thereof. Of course it is not necessary to have both CCD cameras 79a and 79b, as only one will suffice if the system is to be employed exclusively with one type of wafer.

Operating in conjunction with CCD cameras 79a and 79b are light emitters 77a and 77b. Each emitter corresponds to a CCD camera, and light therefrom passes to the associated CCD camera when the reference indicium in the form a edge notch is at an appropriate position indicative of a particular orientation of the wafer 74.

The orienting assembly 78 is designed to support the semiconductor wafer 74 in pre-aligner 70, and to rotate the wafer to thereby change its orientation if necessary, for instance in response to signals from CCD cameras 79a/79b. To that end, a rotatable chuck 80 is provided, which chuck can be rotated by actuation of a motor 82 linked thereto via mechanical linkage 84. Operating in conjunction with detecting assembly 76, orienting assembly 78 can serve to rotate the wafer 74 to a desired orientation, as indicated by CCD cameras 79a/79b, before the wafer is again retrieved by the handling robot and transferred to the appropriate processing station (not shown) in enclosure 26. It will of course be appreciated that a different order of events—for example, orienting the wafer can take place between different processing tasks—can be implemented without departure from the spirit and scope of the invention.

An exemplary mode of operation begins with substrate storage pod 22, containing a plurality of substrates such as semiconductor wafers 74, being placed on support 59. A mechanical means (not shown) in support 59 draws pod 22 against wall 24, and biases the pod so as to ensure a seal between the pod and the door. At this point, accessing the interior of storage pod 22 commences. Translational motion assembly 36 of access mechanism 20 proceeds to engage pod door 32, using latching mechanism 52 and alignment pins 48, and withdraws the pod door into recess 30 of enclosure door 21. Transverse motion assembly 63 then causes retraction of enclosure door 21, along with pod door 32, such that port 28 is cleared and access to the interior of substrate storage pod 22 is gained. The level of pre-aligner 70 is then adjusted to match the level of the first wafer 74 to be retrieved. A substrate handling robot (not shown) in enclosure 26 then retrieves a wafer 74 from within pod 22 and delivers it to pre-aligner 70 for proper orientation thereby. The handling robot then delivers the wafer 74 to one or more processing stations (not shown) within the enclosure 26. After processing, the wafer 74 is returned to the storage pod 22. Enclosure door 21 and pod door 32 are then moved, incrementally, to a second open position corresponding to the next wafer 74 in the stack of wafers in pod 22. The level of the pre-aligner 70 is also adjusted, incrementally, to match the level of the next wafer 74 in the storage pod 22, and the above steps are repeated with the next wafer, and so on. Finally, when all the wafers 74 have been processed in this fashion, the accessing step above is reversed, and the substrate storage pod 22 and the micro environment enclosure 26 are once again sealed from each other. A new storage pod 22 can then replace the old one on support 59, and the wafers in the new storage pod then processed as desired. It will be appreciated that many of the above steps can overlap such that all or a portion of one or more of these steps are performed concurrently. It will further be appreciated that the micro environment enclosure 26 can be associated with more than one of the aforementioned devices. For example, multiple ports 28 can be used to gain access to banks of storage pods 22, with multiple integrated substrate pre-aligner and storage pod access mechanisms being utilized by a system associated wit the micro environment enclosure 26. In fact, the aforementioned design facilitates such multi-component configurations because the integrated substrate pre-aligner and storage pod access mechanism of the invention lends to a more compact arrangement, increasing system capacity.

The above are exemplary modes of carrying out the invention and are not intended to be limiting. It will be apparent to those of ordinary skill in the art that modifications thereto can be made without departure from the spirit and scope of the invention as set forth in the following claims.

What is claimed is:

1. In a system in which the interior of a substrate storage pod having a removable pod door is accessed from the interior of a micro environment enclosure, an integrated substrate handler comprising:

an enclosure door mounted for movement between one or more open positions and a closed position, wherein in an open position the interior of the substrate storage pod is accessible from the interior of the micro environment enclosure; and a pre-aligner mounted for movement with the enclosure door, the pre-aligner being adapted to detect the orientation of a substrate and to adjust the orientation of the substrate in response to detection of the orientation of the substrate.

2. The integrated substrate handler of claim 1, wherein the pre-aligner is mounted on the enclosure door.

3. The integrated substrate handler of claim 1, wherein the enclosure door is provided with a recess for retaining the removable pod door.

4. The integrated substrate handler of claim 1, further comprising:

a translational motion assembly adapted to translate the removable pod door relative to the substrate storage pod in a first, substantially straight path; and a transverse motion assembly adapted to translate the removable pod door and the enclosure door in a second, substantially straight path which is transverse to the first path.

5. The integrated substrate handler of claim 4, wherein the translational motion assembly comprises:
   a movable platform;
   a latching mechanism mounted to the movable platform and adapted to engage the pod door;
   a motor; and
   a linkage connecting the motor to the movable platform such that actuation of the motor causes translation of the pod door along the first path when the latch mechanism is engaging the pod door.

6. The integrated substrate handler of claim 5, wherein the translational motion assembly further comprises one or more alignment pins rigidly mounted relative to the movable platform and adapted to mate with corresponding alignment holes of the pod door.

7. The integrated substrate handler of claim 5, wherein the linkage comprises a ball screw threadingly mated with a nut.

8. The integrated substrate handler of claim 4, wherein the transverse motion assembly comprises:
   a motor; and
   a linkage connecting the motor to the movable enclosure door such that actuation of the motor causes translation of the enclosure door along the second path.

9. The integrated substrate handler of claim 8, wherein the linkage comprises a ball screw threadingly mated with a nut.

10. The integrated substrate handler of claim 1, wherein the pre-aligner comprises:
    a detecting assembly which generates a signal indicative of the orientation of the substrate; and
    an orienting assembly having a chuck on which the substrate is supported, the chuck being rotatable such that rotation of the chuck causes rotation of the substrate.

11. The integrated substrate handler of claim 10, further comprising a motor mechanically linked to the chuck such that actuation of the motor rotates the chuck, the motor being rotated in response to signals from the detecting assembly.

12. The integrated substrate handler of claim 10, wherein the detecting assembly comprises a light emitter and light detector configured such that a reference indicium of the substrate controls a characteristic of light reaching the light detector from the light emitter.

13. The integrated substrate handler claim 12, wherein the reference indicium is an edge notch provided on the substrate.

14. The integrated substrate handler of claim 10, wherein the detecting assembly is responsive to the orientation of more than one type of substrate.

15. In a system in which the interior of a substrate storage pod having a removable pod door is accessed from the interior of a micro environment enclosure having an enclosure door, the system including a pre-aligner, a substrate handling method comprising:
    incrementally moving the enclosure door to a plurality-of open positions;
    incrementally moving the pre-aligner to a plurality of positions each corresponding to an open position of the enclosure door;
    transporting a substrate from the interior of the substrate storage pod to the pre-aligner;
    detecting the orientation of the transported substrate at the pre-aligner; and,
    adjusting the orientation of the substrate at the pre-aligner.

16. The method of claim 15, further comprising changing the orientation of the transported substrate at the pre-aligner.

17. The method of claim 15, wherein the pre-aligner is mounted to the enclosure door.

18. The method of claim 15, further comprising incrementally moving the removable pod door with the enclosure door.

19. In a system in which the interior of a substrate storage pod having a removable pod door is accessed from the interior of a micro environment enclosure having an enclosure door, wherein the storage pod has a plurality of storage locations at which substrates are stored and wherein the system includes a pre-aligner, a substrate handling method comprising:
    moving the enclosure door to a plurality of open positions corresponding to the storage locations;
    moving the pre-aligner with the enclosure door; detecting the orientation of the substrate;
    changing the orientation of the substrate in response to said orientation detecting using the pre-aligner; and
    transporting a substrate between the interior of the substrate storage pod and the interior of the micro environment enclosure.

20. The method of claim 19, further comprising detecting the orientation of the a substrate using the pre-aligner.

21. The method of claim 19, wherein the pre-aligner is mounted to the enclosure door.

22. The method of claim 19, further comprising moving the pod door with the enclosure door.

* * * * *